United States Patent
Savastiouk et al.

(10) Patent No.: US 7,186,586 B2
(45) Date of Patent: Mar. 6, 2007

(54) INTEGRATED CIRCUITS AND PACKAGING SUBSTRATES WITH CAVITIES, AND ATTACHMENT METHODS INCLUDING INSERTION OF PROTRUDING CONTACT PADS INTO CAVITIES

(75) Inventors: Sergey Savastiouk, San Jose, CA (US); Patrick B. Halahan, San Mateo, CA (US); Sam Kao, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 11/253,943

(22) Filed: Oct. 19, 2005

(65) Prior Publication Data

US 2006/0035416 A1 Feb. 16, 2006

Related U.S. Application Data

(62) Division of application No. 10/739,788, filed on Dec. 17, 2003, now Pat. No. 7,049,170.

(51) Int. Cl.
*H01L 21/44* (2006.01)
(52) U.S. Cl. .................. 438/108; 438/106; 438/107; 438/109; 438/110; 438/111; 438/112; 438/120; 438/121; 438/122; 438/597; 257/E21.511
(58) Field of Classification Search ............ None
See application file for complete search history.

(56) References Cited

U.S. PATENT DOCUMENTS 5,391,514 A 2/1995 Gall et al.

(Continued)

FOREIGN PATENT DOCUMENTS

DE 195 31 158 A1 2/1997

(Continued)

OTHER PUBLICATIONS

Ekstrom; Bjorn "Thin Film Silicon Substrates For Lead Frame Packages" Advancing Microelectronics—May/Jun. 2003, pp. 6-7.

(Continued)

*Primary Examiner*—Michael Lebentritt
*Assistant Examiner*—Kyoung Lee
(74) *Attorney, Agent, or Firm*—Michael Shenker; MacPherson Kwok Chen & Heid LLP

(57) ABSTRACT

A packaging substrate (310) includes a semiconductor interposer (120) and at least one other intermediate substrate (110), e.g. a BT substrate. The semiconductor interposer has first contact pads (136C) attachable to dies (124) above the interposer, and second contact pads (340) attachable to circuitry below the interposer. Through vias (330) are made in the semiconductor substrate (140) of the interposer (120). Conductive paths going through the through vias connect the first contact pads (136C) to the second contact pads (340). The second contact pads (340) protrude on the bottom surface of the interposer. These protruding contact pads (340) are inserted into vias (920) formed in the top surface of the BT substrate. The vias provide a strong mechanical connection and facilitate the interposer handling, especially if the interposer is thin. In some embodiments, an interposer or a die (124.1) has vias in the top surface. Protruding contact pads (340.1, 340.2) of another die (124.1, 124.2) are inserted into these vias to provide a strong connection.

27 Claims, 12 Drawing Sheets

U.S. PATENT DOCUMENTS

| | | | |
|---|---|---|---|
| 6,163,456 | A | 12/2000 | Suzuki et al. |
| 6,175,158 | B1 | 1/2001 | Degani et al. |
| 6,322,903 | B1 | 11/2001 | Siniaguine et al. |
| 6,498,074 | B2 | 12/2002 | Siniaguine et al. |
| 6,498,381 | B2 | 12/2002 | Halahan et al. |
| 6,661,088 | B1 | 12/2003 | Yoda et al. |
| 6,903,443 | B2 | 6/2005 | Farnworth et al. |
| 2001/0019178 | A1 | 9/2001 | Brofman et al. |
| 2002/0036340 | A1 | 3/2002 | Matsuo et al. |
| 2002/0048916 | A1 | 4/2002 | Yanagida |
| 2002/0074637 | A1 | 6/2002 | McFarland |
| 2002/0175421 | A1 | 11/2002 | Kimura |
| 2003/0047798 | A1 | 3/2003 | Halahan |
| 2003/0080437 | A1 | 5/2003 | Gonzalez et al. |
| 2003/0116859 | A1 | 6/2003 | Hashimoto |
| 2003/0199123 | A1 | 10/2003 | Siniaguine |

FOREIGN PATENT DOCUMENTS

| | | |
|---|---|---|
| EP | 0 193 128 | 9/1986 |
| JP | 08-236579 | 9/1996 |
| WO | WO 01/45476 | 6/2001 |

OTHER PUBLICATIONS

200mm Wafer Fab Strand Interconnect, Partner for High Performance Electronics.

Chapter 7: Wedge and Double Cantilever Beam Tests on a High Temperature Melt Processable Polymide Adhesive, TPER-BPDA-PA, pp. 221-242.

Design Notes: Understanding Ball Grid Array Packages Electronics by Design, www.electronicsbydesign.com.au, issue Oct. 1997, pp. 1-4.

Flip Chip Bonding in Practice Issue No. 7, Sep. 2001, The Micro Circuit Engineering Newsletter.

Gektin, Vadim; Bar-Cohen, Avram; Witzman, Sorin "Coffin-Mason Based Fatigue Analysis of Underfilled DCAs," 1998 IEEE Transactions on Components, Packaging, and Manufacturing Technology, Part A, vol. 21, No. 4, Dec. 1998, pp. 577-584.

Gilleo, Ken "Substrates for Flip Chips" "Flip Chips Technology" in Area Array Packaging Handbook—Manufacturing and Assembly; K Gillio, Editor; The McGraw-Hill Companies, Inc., New York, NY.

Guenin, Bruce M. "The Many Flavors of Ball Grid Array Packages" Electronics Cooling, Feb. 2002, pp. 1-7.

HPMX-5001: Demonstration Circuit Board: Application Brief 102 Hewlett Packard, pp. 1-10.

Introduction to Printed Wiring Boards Netpack Education Pool, p. 1-18.

Jasper, Jorg "Gold or Solder Chip Bumping, the choice is application dependent" Chip Interconnection, EM Marin, pp. 1-4.

Jordan, Jerry "Gold Stud Bump In Flip-Chip Applications," 2002 Palomar Technologies, Inc.

Lu, H. and Bailey, C. "Predicting Optimal Process Conditions for Flip-Chip Assembly Using Copper Column Bumped Dies" School of Computing and Mathematical Sciences, 2002 IEEE, 2002 Electronics Packaging Technology Conference, pp. 338-343.

Maiwald, Werner "Soldering SMD's Without Solder Paste" http://www.midwestpcb.com/sales/Kehoe/maiwald.htm.

Moon, K.W.; Boettinger, W.J.; Kattner, U.R.; Biancaniello, F.S.; Handwerker, C.A. "The Ternary Eutectic of Sn-Ag-Cu Colder Alloys" Metallury Division, Materials Science and Engineering Laboratory NIST Gaithersburg, MD 20899 USA.

Painaik, Mandar; and Hurley, Jim "Process Recommendations for Assembly of Flip Chips Using No-Flow Underfill" Semiconductor Products, Technical Bulletin, www.cooksonsemi.com.

Pang, John H.L.; Chong, D.Y.R.; Low T.H. "Thermal Cycling Analysis of Flip-Chip Solder Joint Reliability" IEEE Transactions on Components and Packaging Technologies, vol. 24, No. 4, Dec. 2001, pp. 705-712.

Perfecto, Eric; Lee, Kang-Wook; Hamel, Harvey; Wassick, Thomas; Cline, Christopher; Oonk, Matthew; Feger, Claudius; McHerron, Dale, "Evaluation of Cu Capping Alternatives for Polymide-Cu MCM-D" IEEE, 2001 Electronic Components and Technology Conference.

Production Qualification Report: Select Qual B: Strand Substrate on MCM MQFP Qual Amkor Technology, Date Released: Jun. 14, 2002.

Solving Soldering Hierarchy Problems by Metallurgy and Design IBM Technical Disclosure Bulletin, IBM Corp. New York, US, vol. 33, No. 8, Jan. 1991, pp. 298-299, XP000106967, ISSN: 0018-8689.

Sperling, Ed; Electronic News, Sep. 17, 2003.

Staychip; 2078E No-Flow Fluxing Underfill; For Solding Sn/Pb eutectic solder bumps to common pad metallizations Preliminary Technical Bulletin Semiconductor Products, Technical Bulletin; Cookson Electronics.

Strand is Closing the Enterprise Strand Interconnect AB, Viggengatan5, SE-602 09 Norrkoping Sweden, www.strandinter.se.

Technical Data Sheet: No-Clean Pin-Probe Testable Solder Paste: NC253 www.aimsolder.com.

Tran, S.K.; Questad, D.L.; Sammakia, B.G. "Adhesion Issues in Flip-Chip on Organic Modules," 1998 InterSociety Conference on Thermal Phenomena, pp. 263-268.

U.S. Appl. No. 10/739,707, entitled "Packaging Substrates For Integrated Circuits and Soldering Methods," Filed on Dec. 17, 2003.

U.S. Appl. No. 10/798,540, entitled "Attachment of Integrated Circuit Structures and Other Substrates to Substrates with Vias," Filed on Mar. 10, 2004.

Wang, C.H.; Holmes, A.S.; Gao, S. "Laser-Assisted Bump Transfer for Flip Chip Assembly," 2000 IEEE Int'l Symp on Electronic Materials & Packaging, pp. 86-90.

Wang, Tie; Tung, Francisca; Foo, Louis; and Dutta, Vivek "Studies on A Novel Flip-Chip Interconnect Structure—Pillar Bump" Advanpack Solutions Pte Ltd, 2001 IEEE, 2001 Electronic Components and Technology Conference.

www.flipchips.com/tutorial27.html "Flipchips: Tutorial 27, Shaping Gold Stud Bumps" pp. 1-8.

Zama, Satoru; Baldwin, Daniel F; Hikami, Toshiya; Murata, Hideaki "Flip Chip Interconnect Systems Using Wire Stud Bumps and Lead Free Solder," 2000 IEEE Electronic Components and Technology Conference, pp. 1111-1117.

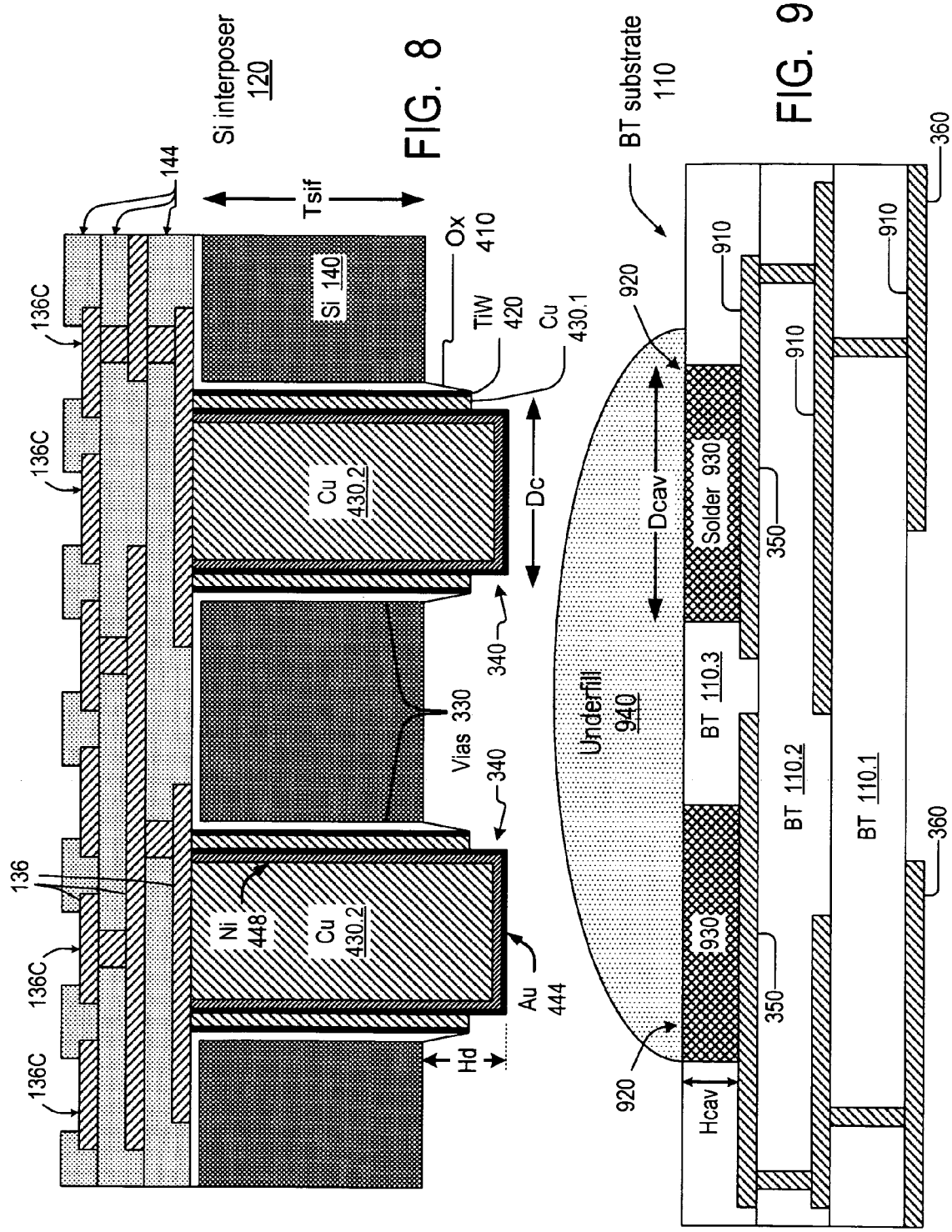

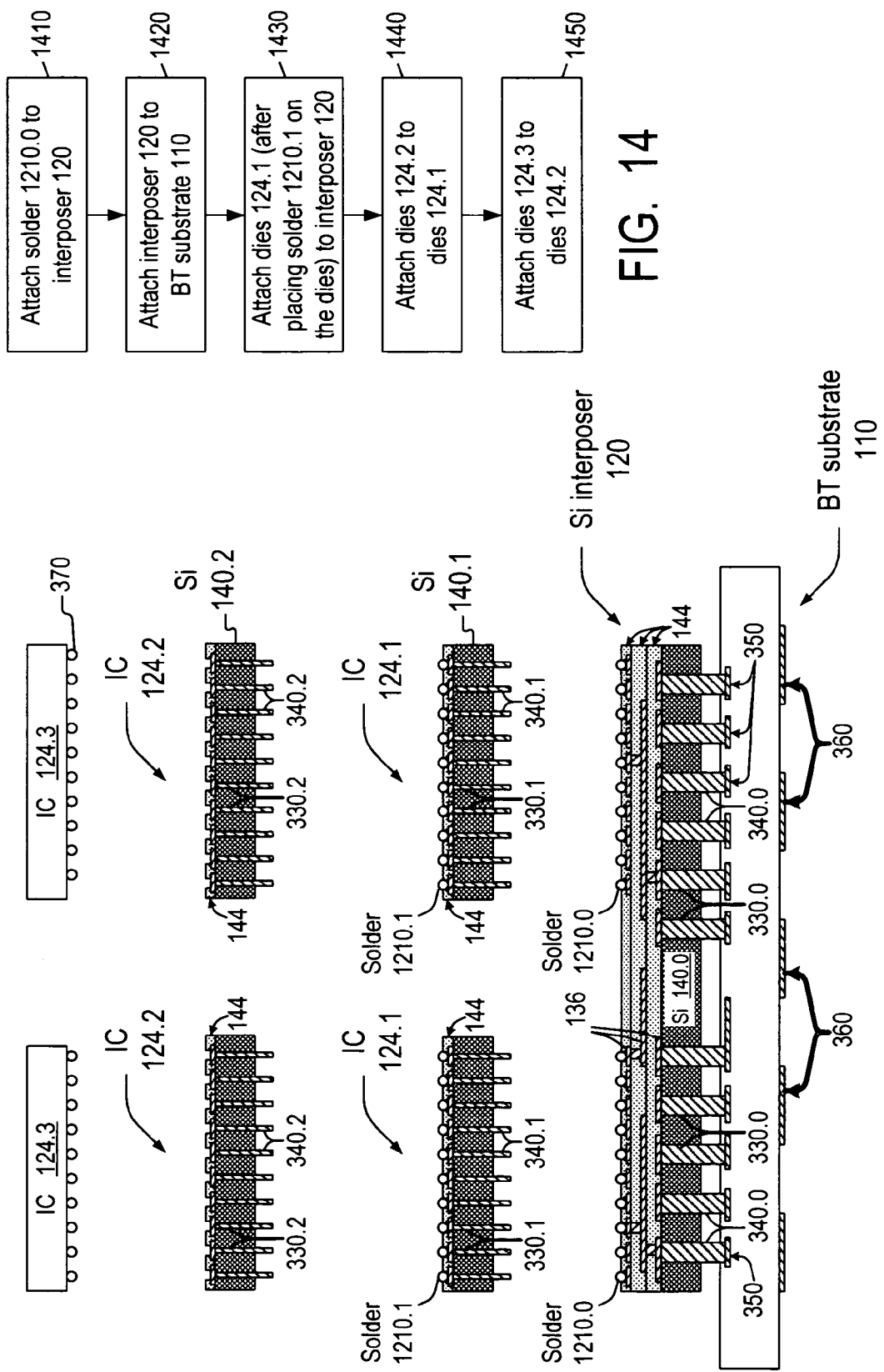

US 7,186,586 B2

INTEGRATED CIRCUITS AND PACKAGING SUBSTRATES WITH CAVITIES, AND ATTACHMENT METHODS INCLUDING INSERTION OF PROTRUDING CONTACT PADS INTO CAVITIES

CROSS REFERENCE TO RELATED APPLICATIONS

The present application is a divisional of U.S. patent application Ser. No. 10/739,788 filed on Dec. 17, 2003 now U.S. Pat. No. 7,049,170 by S. Savastiouk et al., entitled "INTEGRATED CIRCUITS AND PACKAGING SUBSTRATES WITH CAVITIES, AND ATTACHMENT METHODS INCLUDING INSERTION OF PROTRUDING CONTACT PADS INTO CAVITIES", incorporated herein by reference.

BACKGROUND OF THE INVENTION

The present invention relates to attachment of integrated circuits to other integrated circuits and/or intermediate substrates.

Integrated circuit dies ("chips") can be attached to a lead frame and then packaged in a ceramic or plastic carrier. The leads of the lead frame can then be soldered to a printed circuit board (PCB). Alternatively, the chip can be soldered directly to the PCB ("flip chip" packaging). The flip chip packaging reduces the package size and shortens the electrical connections between the die and the PCB, but the flip chip packaging is vulnerable to solder failures caused by thermal expansion and contraction. The solder failures are due to the differences in the coefficient of thermal expansion (CTE) between the die and the PCB.

The CTE mismatch has been addressed by providing an intermediate substrate between the die and the PCB, with an intermediate CTE. For example, in a ball grid array (BGA) package shown in FIG. 1, die ("IC") 124 is flip-chip attached, with solder 126, to the intermediate substrate 110 ("BGA substrate"), and BGA substrate 110 is soldered to PCB 130 (with solder 134). BGA substrate 110 provides interconnect lines (not shown) between die 124 and PCB 130. A silicon die 124 may have a CTE of about 2.7 ppm/° C. (parts per million per degree Centigrade); a PCB made of FR4 can have a CTE of about 20 ppm/° C.; a BGA substrate made from BT (bis-maleimide triazine) has a CTE of about 16 ppm/° C., and a BGA substrate made from ceramic has a CTE of about 9 ppm/° C.

In addition to reducing the thermal stresses, the intermediate substrate 110 may allow a smaller die size by allowing the die 124 to have smaller contact pads with a reduced pitch. The minimum size and pitch of the die's contact pads is limited by the size and pitch of the contact pads on the substrate to which the die is attached. For example, if the die is flip-chip bonded to a BT substrate, the size and pitch of the die's contact pads can be smaller than if the die is attached to an FR4 substrate (PCB).

Intermediate substrate 110 may also reduce the PCB area taken by the die because the intermediate substrate may redistribute the die's contact pads. The position of the die's contact pads is restricted by the die's circuitry. The BGA substrate's contact pads that are bonded to the PCB are not restricted by the die's circuitry. For example, the die may have contact pads only on the periphery, but the BGA substrate's contact pads attached to the PCB may be evenly distributed over the BGA area.

Further, if multiple dies 124 are mounted on a single intermediate substrate 110, the dies can be interconnected by interconnects in the intermediate substrate without using the PCB routing resources. This leads not only to saving the PCB area but also to shorter interconnections between the dies and hence to a better electrical performance (higher speed and lower power consumption, inductance and capacitance).

FIG. 2 illustrates another package with two intermediate substrates 110, 120 between dies (ICs) 124 and PCB 130. Intermediate substrate 110 is a BT substrate, soldered to the underlying PCB 130 with solder balls 134. Intermediate substrate 120 is a silicon interposer attached to the top surface of BT substrate 110 by an adhesive (not shown). Silicon interposer 120 includes metal layers 136 formed over silicon substrate 140 and separated by dielectric layers 144. Dies 124 are attached to interposer 120 with their contact pads facing up. The dies' contact pads are wire bonded to contact pads 136C.1 provided by metal layers 136. The wire bonding is done with bond wires 150. Contact pads 136C.2 on top of the interposer are wire bonded to contact pads 360 on top of BT substrate 110 using bond wires 160. Interconnect lines made from layers 136 connect the contact pads 136C.1 to the contact pads 136C.2.

Metal layers 136 provide interconnects between the dies 124. The interconnects can be manufactured on silicon interposer 120 with a higher density and higher electrical performance than on BT substrate 110. There is no CTE mismatch between silicon substrate 120 and silicon dies 124.

We will use the term "packaging substrate" for each of substrates 110, 140, and for a structure consisting of the substrates 110 and 140 attached to each other. It is desirable to provide a reliable attachment between the packaging substrates 110, 140. The attachment should be mechanically strong. The attachment methods should minimize any breakage of the interposer 120, especially if the interposer is thin.

It is also desirable to provide a strong, reliable attachment of integrated circuits to each other and to packaging substrates.

SUMMARY

This section summarizes some features of the invention. Other features are described in the subsequent sections. The invention is defined by the appended claims which are incorporated into this section by reference.

In some embodiments of the present invention, a packaging substrate is provided which, like the packaging substrate of FIG. 2, includes a silicon interposer and a BT substrate. However, the silicon interposer has contact pads both on the top and the bottom, and has through-silicon vias made in the silicon substrate of the interposer. Conductive paths going through the through-silicon vias connect the contact pads on the top of the interposer to the contact pads on the bottom. The contact pads protrude on the bottom surface of the interposer. The protruding contact pads are inserted into vias formed in the top surface of the BT substrate. The vias facilitate the interposer handling, especially if the interposer is thin. The vias also increase the mechanical strength and thermal-stress reliability of the structure.

Silicon interposers with through-silicon vias have been described in U.S. Pat. No. 6,322,903, incorporated herein by reference, but not in a packaging substrate having two or more intermediate substrates as in some embodiments of the present invention. The packaging substrates according to some embodiments of the present invention provide a manufacturing challenge if the silicon interposer is thin. Thin interposers are desirable to reduce the package size and improve the electrical characteristics (by shortening the conductive paths through the interposer). Also, in some embodiments, it is easier to manufacture the through-silicon vias if the interposer is thin. However, thin interposers are fragile, can be warped, and their heat dissipation capabilities are poor, so the interposer handling is complicated. In U.S. Pat. No. 6,322,903, at least in some embodiments, the interposer is thinned only after attachment to a die. However, in a packaging substrate, the interposer may have to be thinned to its final thickness before the die attachment. In some embodiments, the interposer is thinned before attachment to the BT substrate. The semiconductor substrate of the interposer can be quite thin, e.g. 100 μm or thinner. The semiconductor substrate and the interposer may have substantially planar top and bottom surfaces, as opposed to interposers with cavities large enough to contain a die, with the cavities' sidewalls being thicker than the rest of the interposer to increase the interposer's mechanical strength (see U.S. patent application Ser. No. 09/952,263 filed Sep. 13, 2001 by Halahan et al., incorporated herein by reference). The term "substantially planar" indicates that any non-planarity of the semiconductor substrate or the interposer is so minor as to have no significant effect on the mechanical strength of the structure.

Some aspects of the present invention relate to a manufacturing process, and to a BT substrate, that simplifies the handling of thin silicon interposers.

The via structures can also be used to attach the integrated circuits to each other and to packaging substrates. For example, in some embodiments, an integrated circuit die has contact pads protruding on its bottom surface. These contact pads can be inserted into vias formed in the top surface of an interposer or another die to increase the strength of the structure.

The invention is not limited to the embodiments discussed in this section. The invention is not limited to thin interposers, and further is applicable to non-silicon semiconductor interposers attached to non-BT intermediate substrates. Other features and advantages of the invention are described below. The invention is defined by the appended claims.

BRIEF DESCRIPTION OF THE DRAWINGS

FIGS. 3–13 show vertical cross sections of integrated circuit packaging structures according to some embodiments of the present invention.

FIG. 14 is a flowchart of an integrated circuit packaging process according to one embodiment of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 1:
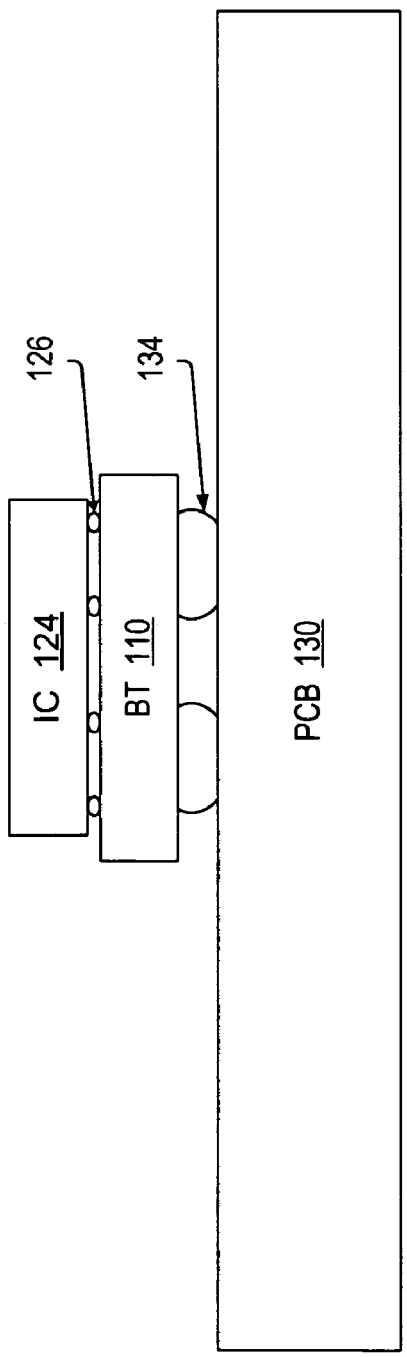
FIGS. 1 and 2 show vertical cross sections of integrated circuit packaging structures according to prior art.
Figure 2:
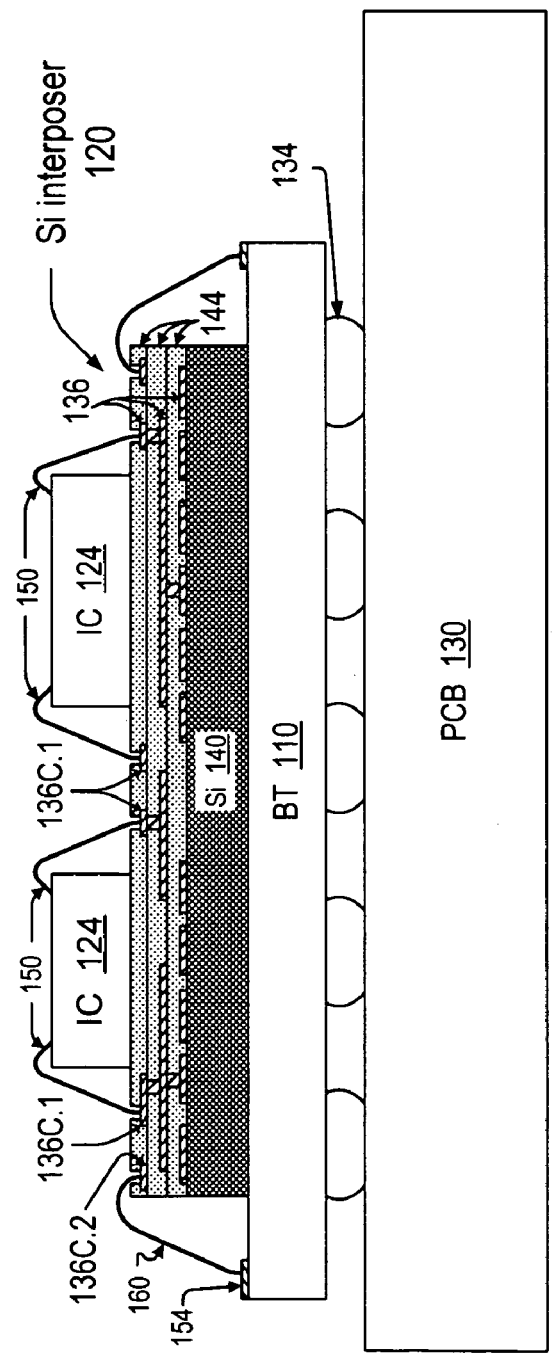
Figure 3:
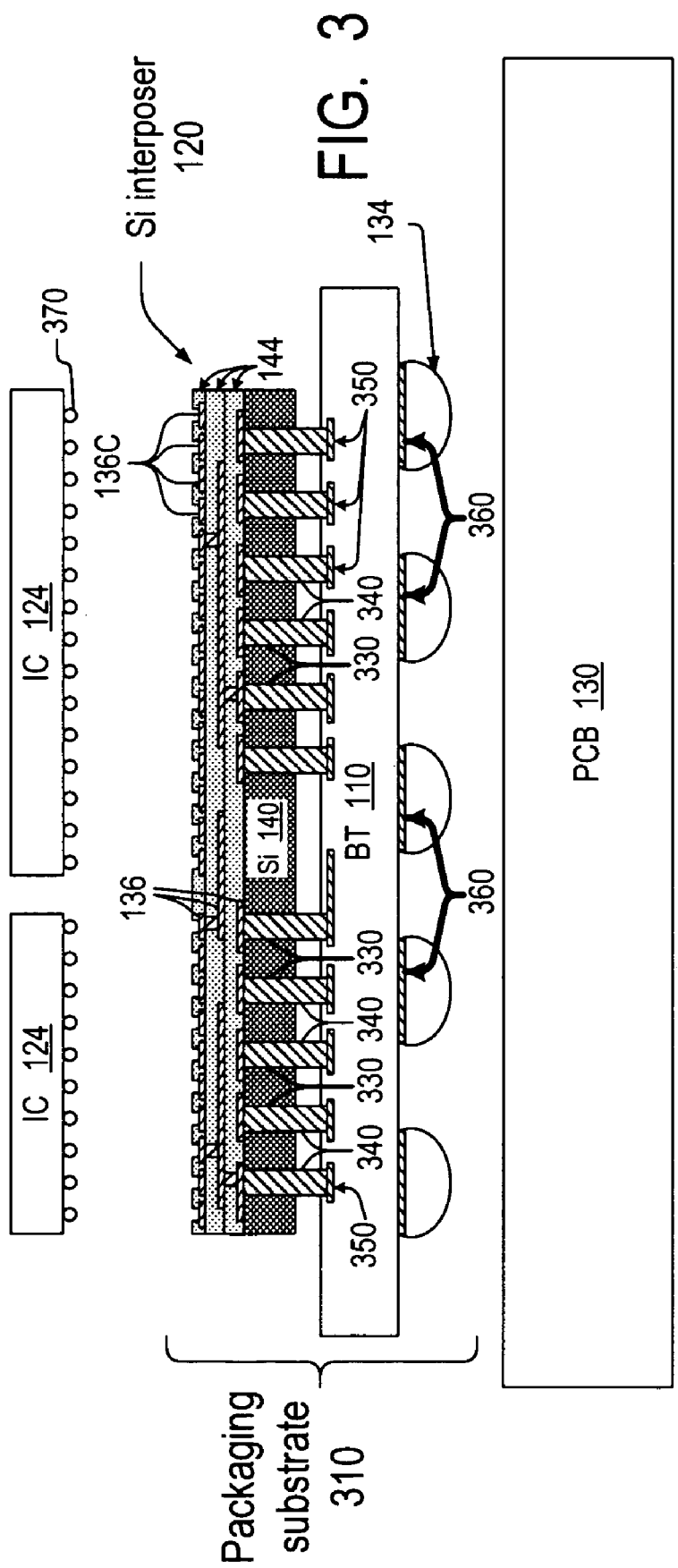

FIG. 3 illustrates an integrated circuit packaging substrate 310 having two intermediate integrated circuit packaging substrates 110, 120. Substrate 120 is a silicon interposer attached to BT substrate 110. Dies 124 and PCB 130 will be attached later.

Silicon interposer 120 includes metal layers 136 formed over silicon substrate 140. Substrate 140 has substantially planar top and bottom surfaces, and is quite thin. In some embodiments, the planarity of substrate 140 is suitable for fine geometry photolithography (finer than possible with BT and FR4 substrates). The thickness of substrate 140 can be 100 μm or less (50 μm to 35 μm thickness values believed to be achievable, and smaller values may be possible). Layers 136 provide interconnect lines and may also provide power and ground planes, resistors, inductors, capacitor plates for decoupling capacitors and other capacitor types, and possibly other elements, known or to be invented. Layers 136 can be separated from each other, and from the substrate, by dielectric layers 144. Layers 136 contact each other and the silicon substrate through openings in the dielectric layers. Layers 136 can also be formed directly on the silicon substrate if desired. Layers 136 provide contact pads 136C at the top surface of the interposer. The contact pads are available for flip-chip attachment to dies 124.

Silicon substrate 140 includes metalized through-silicon vias 330 that pass between the top and bottom surfaces of substrate 140. Conductive paths are provided from contact pads 136C at the top of the interposer to contact pads 340 at the bottom of the interposer through the vias 330. Contact pads 340 are attached to contact pads 350 at the top surface of BT substrate 110.

Interconnects (not shown) in BT substrate 110 connect the contact pads 350 to contact pads 360 at the bottom surface of substrate 110. Solder balls 134 are formed on pads 360 by conventional techniques for attachment to PCB 130.

The size and spacing (pitch) of contact pads 136C on interposer 120 matches the size and the pitch of the contact pads on dies 124. If dies 124 are silicon integrated circuits, their CTE matches the CTE of the interposer, so the pitch of contact pads 136C can be small because the low thermal stresses at the interface between the dies and the interposer make it unnecessary to use large solder balls 370. The contact pads 340 on the bottom of the interposer match the top contact pads 350 of BT substrate 110. For some fabrication technologies, the minimum dimensions are as shown in the following table. The dimensions can typically be reduced if more expensive technologies are used.

| Contacts | Minimum pitch | Solder ball diameter | Solder ball height |
| --- | --- | --- | --- |
| Contact pads 136C | 125 μm | 60 μm (solder balls 370 on IC 124) | 50 μm |
| Contact pads 340, 350 | 254 μm | | |
| Contact pads 360 | 1.27 mm | 0.5 mm (solder balls 134) | 0.4 mm |

To facilitate the interposer handling, the metal contact pads 340 are formed to protrude out of vias 330. The protruding contact pads 340 are inserted into cavities in BT substrate 110, as explained in more detail below. The invention is not limited to the protruding contact pads or the cavities however.

Silicon interposer 120 can be manufactured using conventional techniques. See e.g. the aforementioned U.S. Pat. No. 6,322,903. Other techniques are described in U.S. patent application Ser. No. 10/410,929 filed on Apr. 9, 2003 by P.

Figure 4:
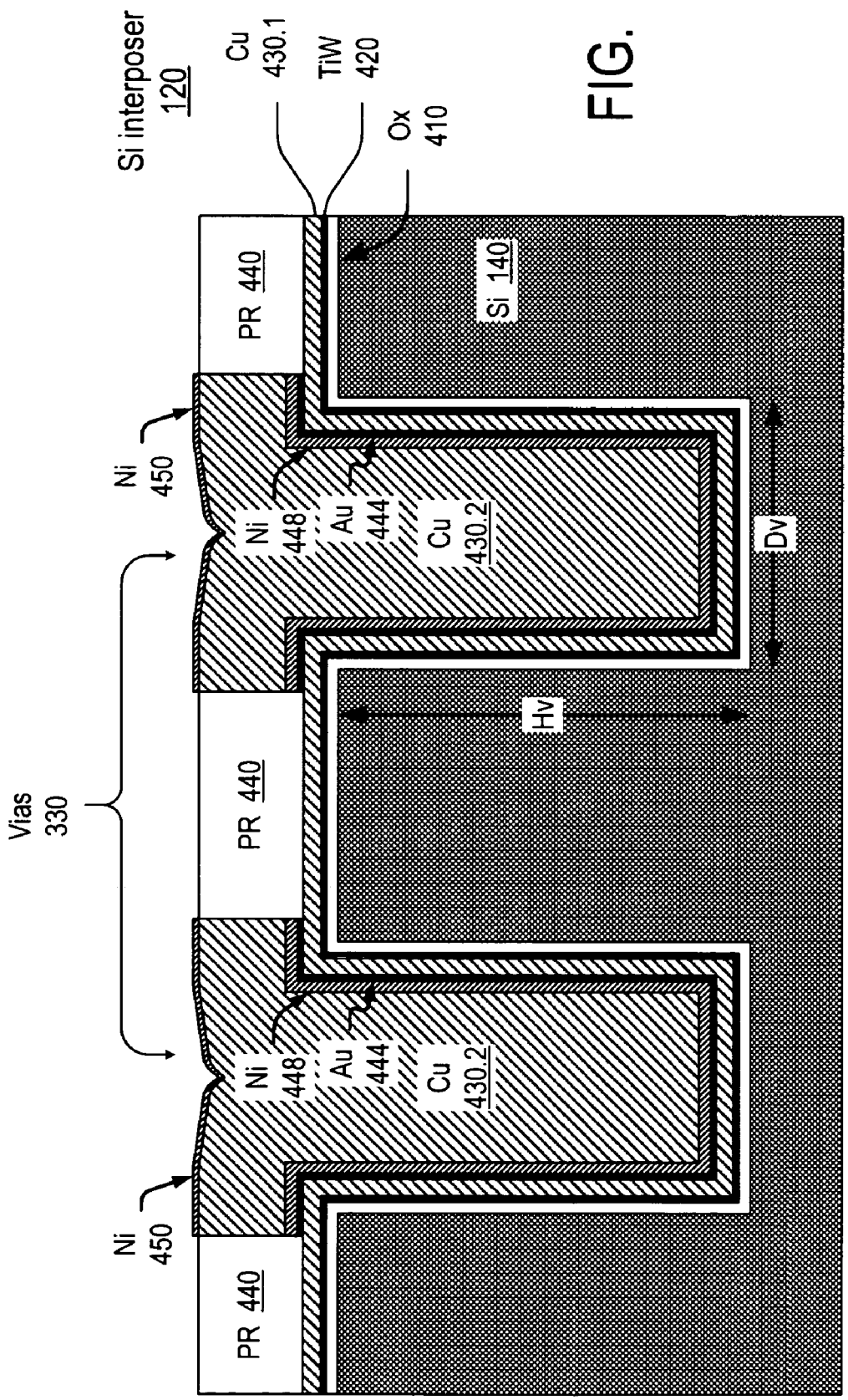

Halahan et al., entitled "Electroplating and electroless plating of conductive materials into openings, and structures obtained thereby", incorporated herein by reference. Still other techniques can possible be used, whether known or to be invented. An exemplary manufacturing process is as follows. Vias 330 (FIG. 4) are etched in the top surface of silicon substrate 140 (e.g. monocrystalline silicon) by DRIE (deep reactive ion etching) to an exemplary depth Hv=150 µm. (The dimensions, etching processes, and other particulars are exemplary and not limiting.) The via diameter Dv is 25 µm to 100 µm. The via diameter DV is one of the parameters defining the diameter of contact pads 340 (FIG. 3), and DV is chosen large enough to provide the necessary mechanical strength for the protruding contact pads. Exemplary dimensions below will be given for Dv=65 µm. Silicon dioxide layer 410 is thermally grown on the wafer to a thickness of about 1 µm. A larger thickness can also be used to reduce the capacitance between substrate 140 and the metal features that will be fabricated in vias 330. Barrier layer 420 of titanium-tungsten (TiW) is sputtered on oxide 410 to a thickness of 0.2 µm. A seed copper (Cu) layer 430.1 is sputtered on the wafer to a thickness sufficient to ensure a continuous copper coverage in the via. Thicknesses of 0.5 µm to 2 µm are believed to be adequate, depending on the sputter technology. A dry photoresist film 440 is deposited on the wafer and patterned to expose the vias 330.

Optionally, gold (Au) layer 444 and nickel (Ni) layer 448 are electroplated, in that order, to an exemplary thickness of 0.2 µm and 1.0 µm respectively.

Copper 430.2 is electroplated on nickel 448 to fill the vias 330 and possibly protrude out of the vias. In the electroplating of layers 444, 448, 430.2, the cathode terminal (not shown) of the power source is placed at the periphery of wafer 140 in physical contact with seed layer 430.1.

Optionally, nickel (Ni) layer 450 is electroplated on the top surface of copper layer 430.2 to an exemplary thickness of 0.5 µm.

Figure 5:
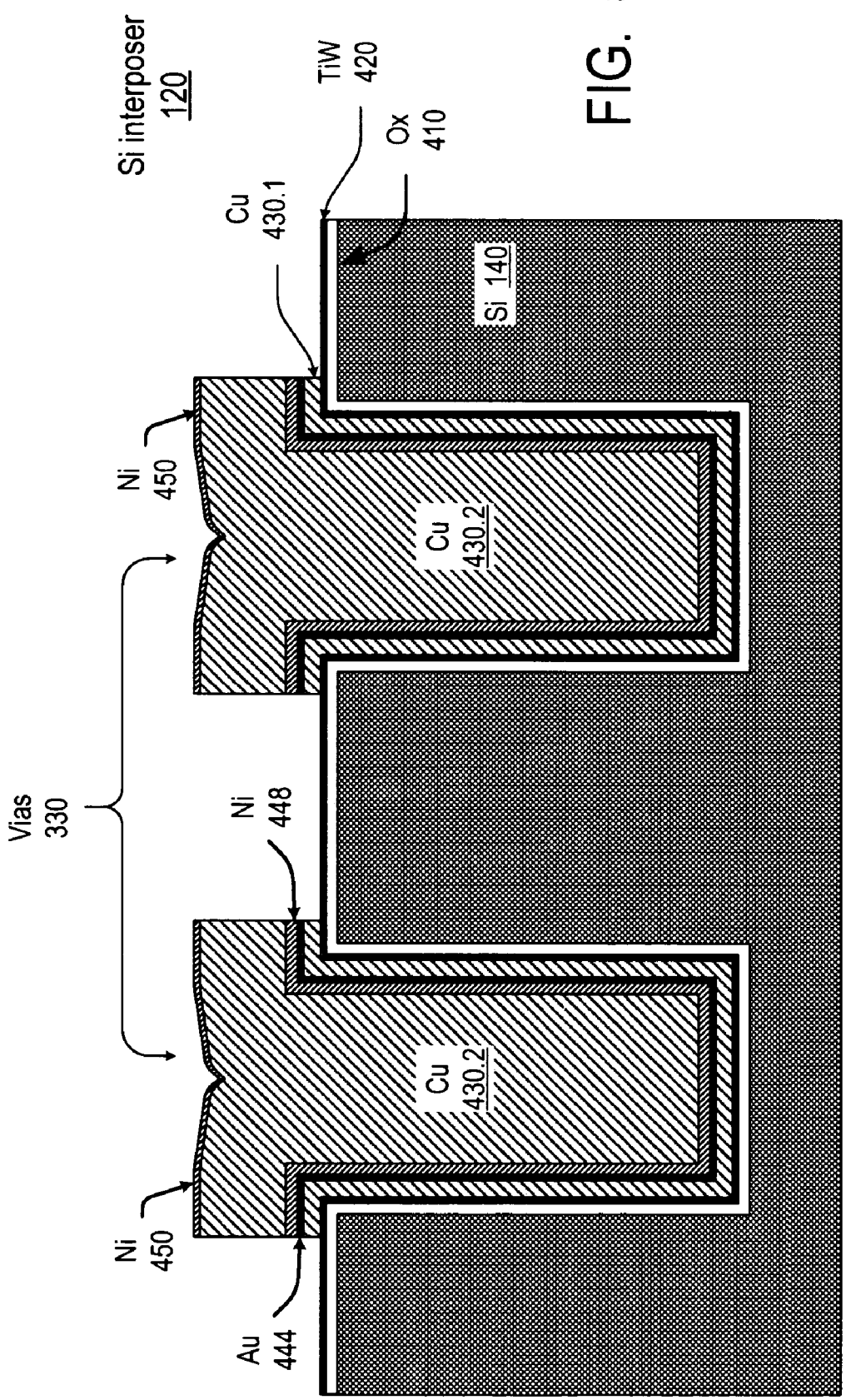

Resist 440 is removed (FIG. 5). A wet copper etch removes the exposed portions of seed copper 430.1, with nickel 450 acting as a mask. Nickel 450 protects copper 430.2 in vias 330. Copper 430.2, 430.1 can be etched laterally during the wet etch, but the lateral etch does not remove the copper over the vias 330 because the copper extends laterally beyond the via edges. In those embodiments in which the nickel 450 is omitted, the copper etch may reduced the thickness of copper 430.2, but this is acceptable if the copper protrusions above the vias are sufficiently thick. In either case, it is desirable for the top surface of copper 430.2 to be at or above the top surface of oxide 410 after the copper etch.

Figure 6:
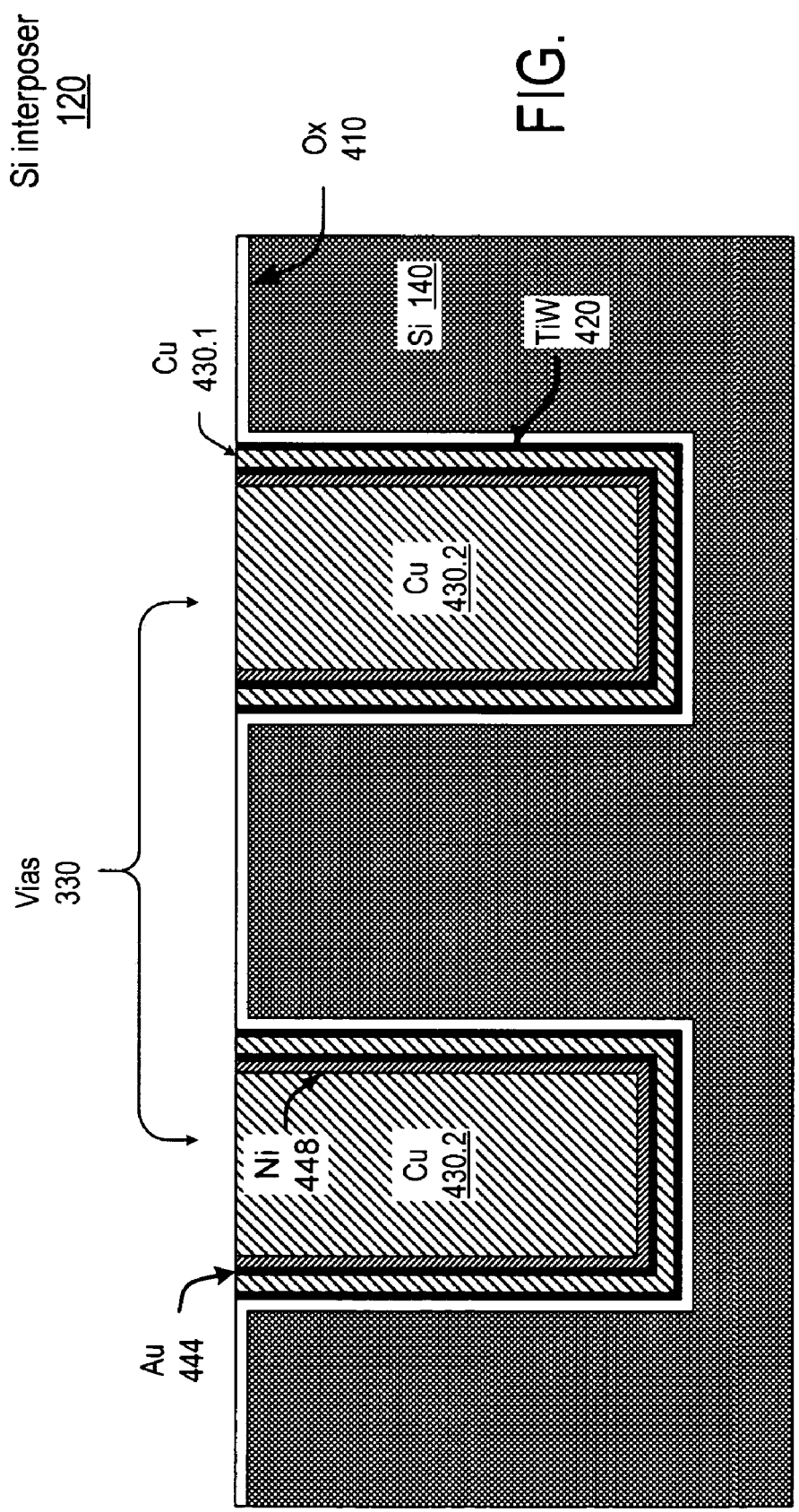

Then a CMP step (chemical mechanical polishing) is performed to remove copper 430.2, nickel 448, gold 444, and TiW 420 off the top surface of substrate 140 (FIG. 6). The CMP stops on oxide 410. The structure has a planar top surface.

In an alternative embodiment, the wet etch of copper 430.1 is omitted, and copper 430.1 is removed by the CMP step. The separate wet etch of copper 430.1 may be desirable however because it may shorten the more expensive CMP step, thus reducing the total manufacturing cost.

Figure 7:
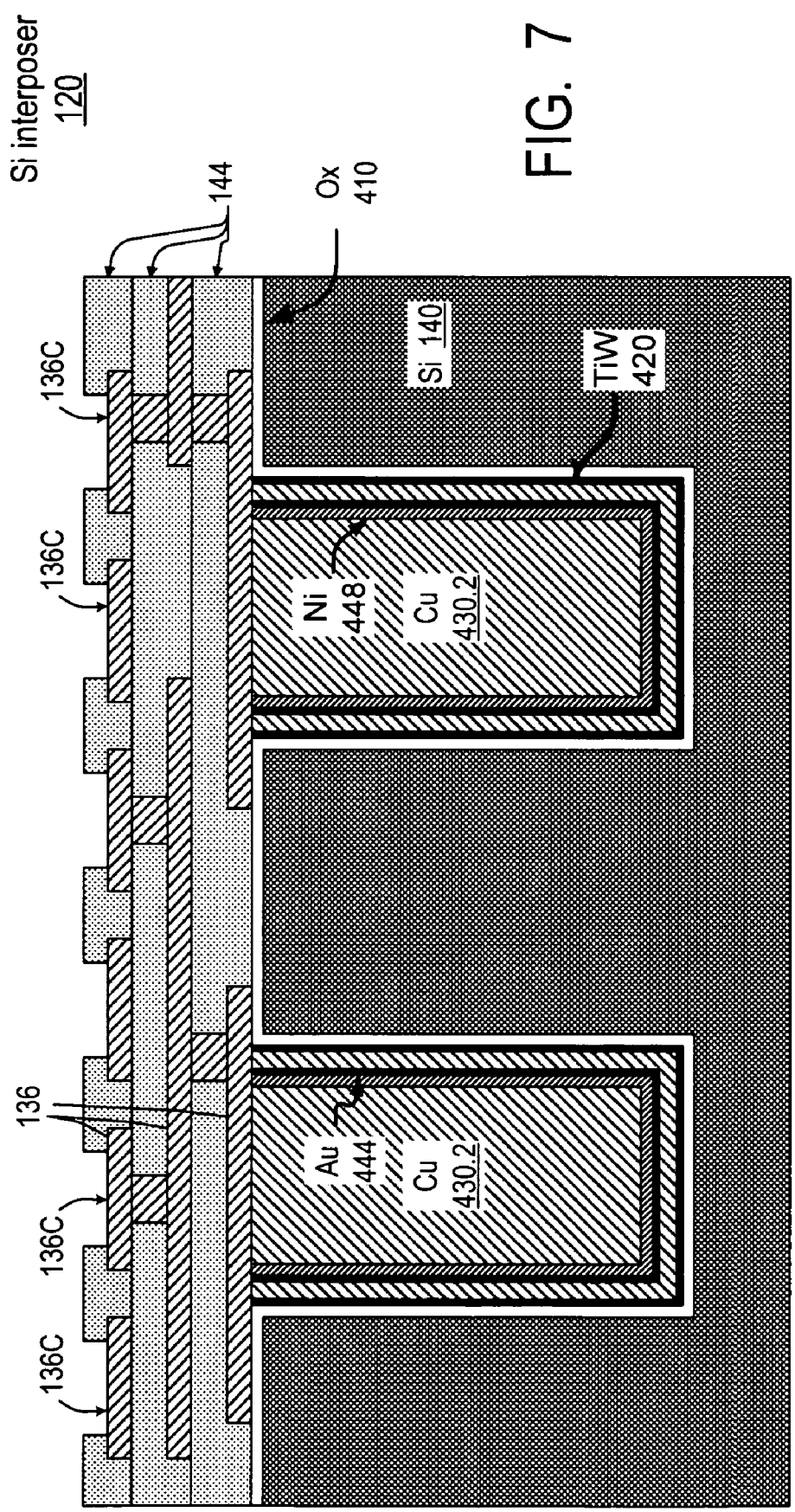

Oxide 410 can be patterned if desired. Metal layers 136 (FIG. 7) and dielectric layers 144 are deposited on the interposer wafer and patterned to provide interconnects and, possibly, other elements as described above. In some embodiments, metal 136 is copper and dielectric 144 is polyimide, but other materials can also be used. Some or all of dielectric layers 144 can be silicon dioxide, photosensitive benzocyclobutene (BCB), polybenzoxazole (PBO), or other materials. For a capacitor, a high dielectric constant material (such as $Ta_2O_5$) can be used. Aluminum, conductive polysilicon, and other materials can be used as layers 136. Solder wettable materials (e.g. Ni or Au) can be plated on contact pads 136C if desired.

Then the interposer wafer is thinned from the bottom to expose the gold 444. See FIG. 8. The exposed metal provides the contact pads 340 (FIG. 3) that will be soldered to BT substrate 110. The wafer thinning can be performed with any of the techniques described in the aforementioned U.S. Pat. No. 6,322,903 and U.S. patent application Ser. No. 10/410,929. See also U.S. Pat. No. 6,498,381 issued on Dec. 24, 2002 to Halahan et al. and incorporated herein by reference. In one embodiment, the wafer thinning includes a $CF_4$ plasma etch at atmospheric pressure. The plasma etch exposes the oxide 410 and then etches the silicon 140, oxide 410 and TiW 420 selectively to copper 430.1. (Copper 430.1 is etched later as explained below.) The plasma etch etches silicon 140 faster than oxide 410, so the oxide protrudes out of the silicon on the bottom surface of the wafer after the etch. In one embodiment, the final thickness "Tsif" (marked in FIG. 8) of silicon substrate 140 is 100 µm, and it can be smaller (e.g. 35 µm). Oxide 410 and TiW 420 form 5 µm protrusions around the copper 430.1 below the silicon surface.

The plasma etch forms copper oxide (not shown) on the exposed portions of copper 430.1. The copper oxide and the copper 430.1 are etched by a wet etch to expose gold 444. The gold provides a solderable oxide-free surface. Nickel 448 will prevent copper diffusion from layer 430.2 into the solder. The copper diffusion may be undesirable because it increases the solder melting temperature. In other embodiments, the copper diffusion is desirable to achieve a certain solder hierarchy (the hierarchy of the melting temperatures of different solders) as explained below. In such embodiments, the etch of copper 430.1 can be omitted.

As stated above, gold 444 can be omitted. The etch of copper 430.1 will then expose nickel 448.

In some embodiments, the copper 430.1 is not etched away. The copper oxide (not shown) on copper 430.1 can be removed by a wet etch. The copper oxide can also be removed by a solder flux during soldering of the interposer wafer to BT substrate 110 (the soldering operation is described below). Layers 444, 448 can be omitted.

Metal contact pads 340 are metal protrusions formed by the metal layers 430.2, 448, 444, 430.1, 420 below the bottom surface of silicon 140. In some embodiments, the height Hd of metal contact pads 340 is 50 µm.

A dielectric layer (not shown) can optionally be formed on the bottom surface of the interposer to cover the silicon 140 but not the metal contact pads 340. The dielectric can be formed without photolithography. See the aforementioned U.S. Pat. Nos. 6,322,903 and 6,498,381 and U.S. patent application Ser. No. 10/410,929.

The interposer wafer can be diced if desired. The dicing can be performed at the same time as the interposer wafer thinning if vias were formed along the dicing lines (scribe lines) simultaneously with vias 330 at the stage of FIG. 4. See U.S. Pat. No. 6,498,074 issued Dec. 24, 2002 to Siniaguine et al., entitled "THINNING AND DICING OF SEMICONDUCTOR WAFERS . . . ", incorporated herein by reference.

In some embodiments, the interposer wafer is not diced. ICs 124 will be attached to the wafer.

In some embodiments, metal 430.2 does not fill the through-silicon vias. Metal 430.2 is a thin film deposited over the via sidewalls, and it can be part of a layer 136. See the aforementioned U.S. Pat. No. 6,498,381. Also, in some embodiments the contact pads 340 do not protrude out of the bottom surface of the interposer.

Interposer 120 (diced or undiced) can be attached to a conventional BT substrate 110 with solder, conductive epoxy, anisotropic adhesive, thermocompression, or possibly by other techniques, known or to be invented. In some embodiments, however, specially processed BT substrates are used to minimize the interposer handling. The interposer handling should preferably be minimized if the interposer is thin. The interposer's silicon substrate 140 can be 100 μm or thinner, the interposer can be fragile, and its heat dissipation capability can be low. Also, the interposer can be warped. Further, some conventional soldering techniques, e.g. the techniques that involve electroplating of solder and under-ball metallurgy layers on contact pads 340, may require photolithography on the bottom surface of the interposer. The use of photolithography is undesirable because of possible wafer damage and mask misalignment. The use of a conventional BT substrate can also be difficult due to a possibly non-uniform height of protruding contact pads 340. Those contact pads 340 that have a smaller height may be unable to reach the BT substrate contact pads 350 (FIG. 3). Therefore, a specially processed BT substrate 110 is used in some embodiments, as shown in FIGS. 9 and 10.

Figure 10:
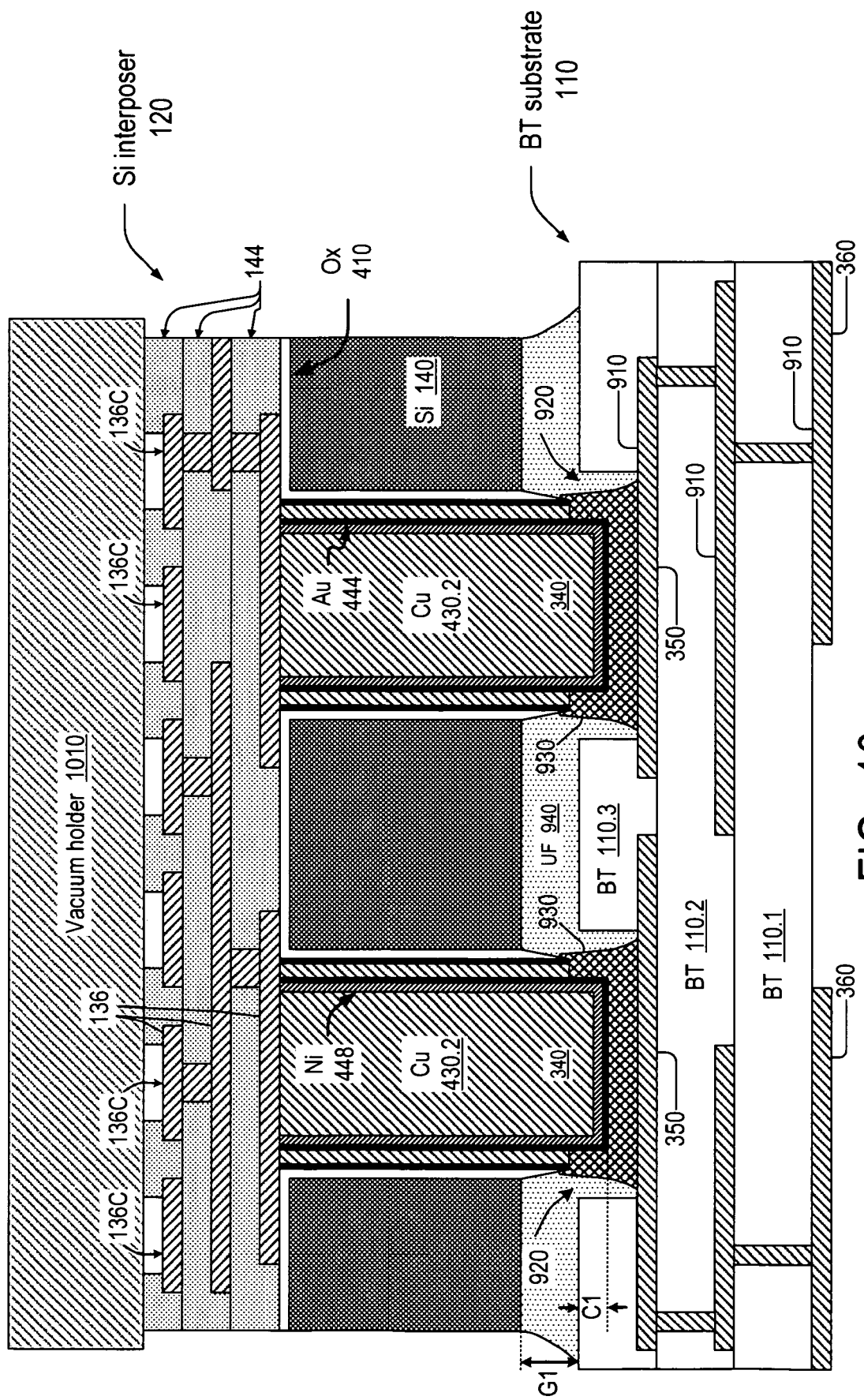

BT substrate 110 of FIGS. 9 and 10 is formed from one or more BT layers laminated in a conventional manner. Three layers 110.1, 110.2, 110.3 are shown, but any number of layers can be present. Thin film metal layers 910 (e.g. copper) are formed on BT layers 110.$i$ (i=1, 2, 3) and on the bottom side of layer 110.1 in a conventional manner to provide signal routing paths and ground and power planes. Layers 910 are interconnected through vias in the BT layers 110.$i$ (i.e. 110.1, 110.2, 110.3) using known techniques to provide conductive paths between contact pads 350 and contact pads 360. The bottom metal layer 910 provides contact pads 360 (FIG. 3) at the bottom surface of BT substrate 110.

The difference between the BT substrate 110 of FIG. 9 and a conventional BT substrate is that the top contact pads 350, and the top metal layer 910, are formed below the top BT layer 110.3. In FIG. 9, the top contact pads 350 and the top metal 910 are formed on BT layer 110.2. Layer 110.3 has vias 920 exposing the contact pads 350. Vias 920 form cavities in the top surface of BT substrate 110. Silicon interposer contact pads 340 will be inserted into these cavities to form a reliable mechanical and electrical contact.

In one embodiment, each cavity 920 has a diameter Dcav=150 μm to accommodate a 50 μm to 60 μm diameter Dc of the contact pads 340. Dc can be calculated starting with the diameter Dv (FIG. 4) of via 330, by subtracting double the thickness of the layers 410, 420, 430.1, 444, 448. The depth Hcav of each cavity 920 (about equal to the thickness of layer 110.3) is 50 μm for a 50 μm height Hd of contact pads 340 (Hcav is measured to the top surface of contact pads 350).

Cavities 920 are filled with solder paste 930. In one embodiment, the solder paste is deposited to cover the BT substrate, and then is wiped off by a squeegee blade to force the solder into cavities 920 and remove it from the top surface of BT layer 110.3.

The solder is chosen to have a high melting temperature to provide a desired solder hierarchy for subsequent solder attachment of dies 124 and PCB 130. In some embodiments, the solder paste is a no-clean type NC253 available from AIM of Montreal, Canada. This paste incorporates solder flux but there is no need to clean the flux after the solder reflow.

No-flow underfill 940 (dielectric) is dispensed on BT substrate 110 at the future site of interposer 120. In some embodiments, the underfill is type STAYCHIP™ 2078E available from Cookson Electronics, a company having an office in Georgia, the United States of America. This underfill performs both the underfill function and the solder flux function. The underfill can be dispensed with a dispensing system of type CAMELOT/SPEEDLINE 1818 available from Cookson Electronics.

Interposer wafer 120 is placed on BT substrate 110 (FIG. 10). Protruding contact pads 340 enter the cavities 920 and contact the solder 930 but do not necessarily reach the metal 910 of contact pads 350. A uniform height of contact pads 340 is not required for a good electrical contact.

Underfill 940 spreads out under the interposer. In the embodiment shown, the bottom surface of silicon 140 does not reach the BT substrate. Underfill 940 helps insulate the silicon from solder 930. Therefore, it is unnecessary to form a dielectric layer on the bottom silicon surface.

The interposer placement can be performed with a placement tool of type SFPLACE F4 available from Siemens corporation of Germany. The placement tool picks up the interposer from the top by a vacuum holder 1010 schematically shown in FIG. 10. The vacuum pick-up flattens the interposer if the interposer is warped. Dielectric 144 protects the interposer from being damaged by the holder. Other placement tools, with vacuum and non-vacuum holders, known or to be invented, can also possibly be used.

The structure is heated to reflow the solder paste 930 and cure the underfill 940. The solder wets the bottom and side surfaces of copper contact pads 340. In one embodiment, the final value of the gap G1 between the silicon 140 and the BT substrate 110 is 25 μm. The gap values of 5 to 10 μm and larger are believed to be appropriate to provide sufficient electrical insulation if no dielectric is formed on the bottom surface of silicon 140. The contact 340 portion inside the vias 920 is 25 μm high (C1=251 μm in FIG. 10). The value C1 is in the range from 10 μm to 45 μm in some embodiments.

Then vacuum holder 1010 releases the interposer.

In some embodiments, the vacuum holder releases the interposer before the solder reflow. The interposer stays in place due to a surface tension between silicon 140 and the underfill 940. Multiple interposers can be placed on BT substrate 110, and the solder reflow and underfill curing can be performed in a single heating step for all the interposers. A similar technique has previously been applied for flip-chip mounting of dies on a BT substrate, as described in M. Painaik and J. Hurtley, "Process Recommendations for Assembly of Flip Chips using No-flow Underfill", Technical Bulletin, Cookson Semiconductor.

Figure 11:
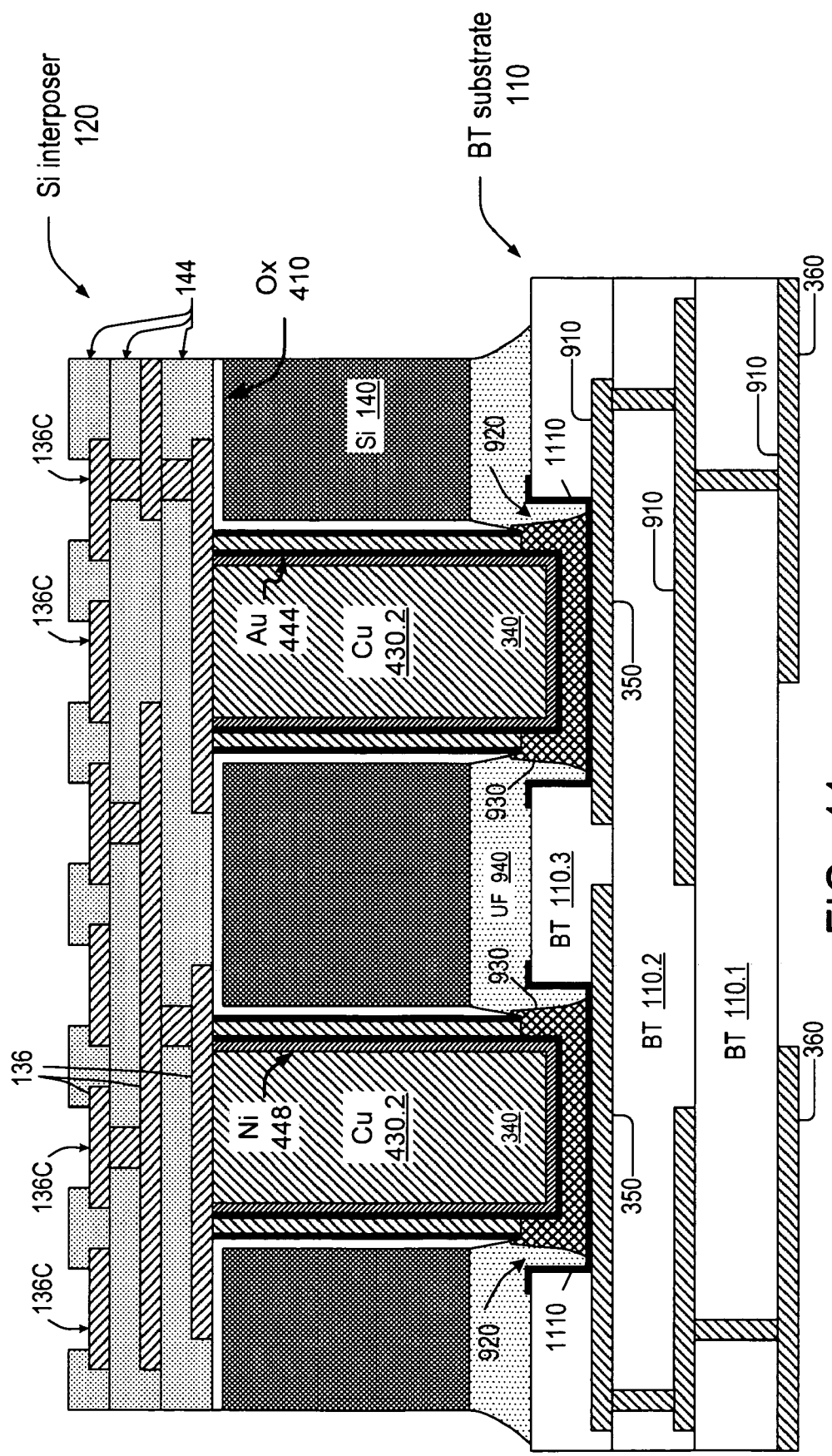

FIG. 11 illustrates another embodiment. The BT substrate 110 is similar to the BT substrate of FIGS. 9 and 10, but a metal layer 1110 is formed on the bottom and sidewalls of each cavity 920. Metal 1110 is believed to improve the strength and the electrical conductivity of the solder bond between contact pads 340 and contact pads 350. Metal layer 1110 can be copper deposited on the BT substrate and patterned by lift-off or some other process. In FIG. 11, metal 1110 extends out of cavities 920 to the top surface of the BT layer 110.3 but does not provide any interconnects or other elements on the top surface of layer 110.3. Metal 1110 is present only in the immediate vicinity of each cavity 920. Each contact 350 includes the portions of metal layers 910, 1110 on the bottom and sidewalls of the corresponding cavity 920. In other embodiments, metal 1110 provides an additional level of interconnects and/or a power or ground plane on layer 110.3.

In the BT embodiment described above, the BT layers 110.1, 110.2, 110.3 are laminated on top of each other. Each layer 110.1, 110.2 is a solid sheet placed laminated on the structure in a solid form. In some embodiments, the top layer 110.3 is made from a material different from the material of layers 110.1, 110.2. For example, solder dam materials can be used, such as photoimageable polyimide, Dupont VACREL 8100, Dupont Flexible PhotoImageable Coverlay (PIC) 1000 & 2000, Shipley (Dynachem) DynaMASK 5000, Shipley ConforMASK 2500, and possibly others. Some of the solder dam materials (e.g. polyimide) can be deposited in a liquid (possibly viscous) form and then cured.

Figure 12:
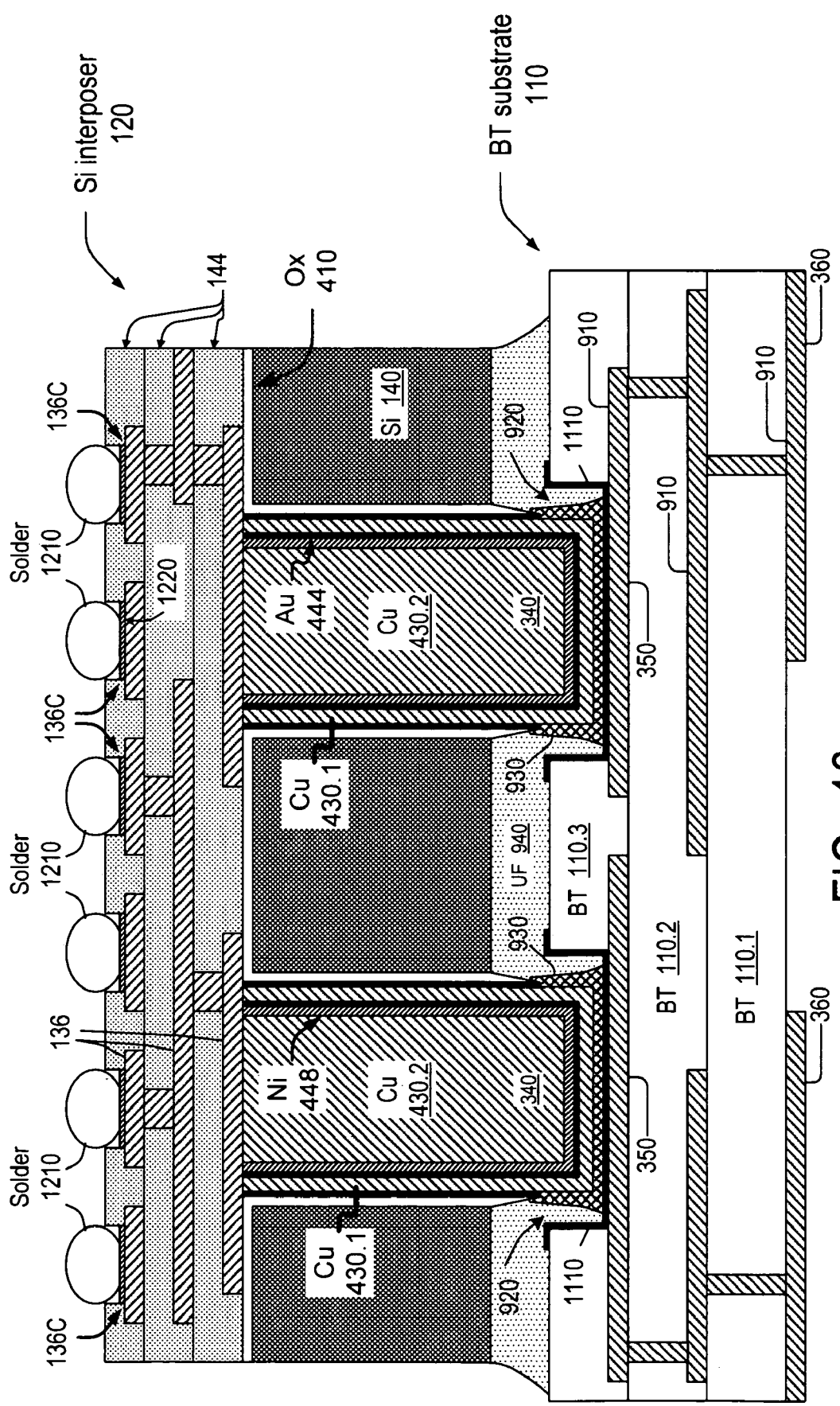

FIG. 12 is similar to FIG. 11, but solder balls 1210 have been attached to contact pads 360C. Solder balls 1210 eliminate the need for solder balls 370 (FIG. 3) on dies 124. The packaging substrate manufacturer can provide solder balls 1210 to simplify the die 124 attachment for the substrate buyers. Solder 1210 can be attached to the interposer at any fabrication stage. In one embodiment, solder 1210 is attached to pads 360C before the interposer wafer is thinned, i.e. before the stage of FIG. 8. The interposer wafer is mechanically stronger at this stage and its heat dissipating capability is higher, so the interposer handling is easier.

Metal 1110 may be omitted (as in FIG. 10).

In some embodiments, solder 1210 has a lower melting temperature than solder 930. Therefore, solder 930 is not melted during the attachment of dies 124.

In the embodiment of FIG. 12, solder 1210 has the same or higher melting temperature than solder 930, but the melting temperature of solder 930 is increased during the attachment of interposer 120 to BT substrate 110. The melting temperature of solder 930 becomes higher than the melting temperature of solder 1210. The melting temperature of solder 930 is increased because the copper from layer 1110 and/or layer 350 dissolves in solder 930. In the embodiment of FIG. 12, copper 430.1 was not etched away as in FIG. 8, so copper 430.1 can also dissolve in the solder. In some embodiments, solders 1210, 930 are initially the same solder (i.e. the same material), which simplifies the wafer fabrication. For example, a eutectic solder Sn/Ag3.0/Cu0.5 (known as type LF128 from AIM) can be used.

Metal contact pads 136C can be formed from a material other than copper. In some embodiments, interconnects 136 are made of copper, but contact pads 136C are plated with a layer 1220 of nickel or gold. Layer 1220 does not dissolve in solder 1210 and provides a barrier for the copper diffusion from interconnects 136, so the melting temperature of solder 1210 does not change. In other embodiments, the melting temperature of solder 1210 changes during the attachment of the interposer to substrate 110, but the melting temperature of solder 1210 remains below the melting temperature of solder 930.

FIGS. 13–14 illustrate a possible manufacturing sequence with multiple die levels 124.1, 124.2, 124.3 attached to the packaging substrate. The packaging substrate is manufactured as in FIG. 12. The interposer vias are marked 330.0 (instead of 330 as in FIG. 12), the contact pads at the bottom of the interposer are marked 340.0, and the solder at the top is marked 1210.0.

Each die 124.1 has one or more metalized through vias 330.1 formed in the die's semiconductor substrate 140.1 (e.g. monocrystalline silicon). Each via 330.1 passes between the top and bottom surfaces of substrate 140.1. Conductive paths are provided from contact pads at the top of the die 124.1 to contact pads 340.1 at the bottom of the die through the vias 330.1. Contact pads 340.1 protrude out of the respective vias 330.1. The dies 124.1 can be manufactured using the same techniques as described above for interposer 120 (involving the wafer thinning to expose the contact pads 340.1). Each die may have the same general structure as interposer 120 in FIG. 12. Of course, the circuitry in dies 124.1 does not have to be identical to the interposer circuitry, and different dies 124.1 may differ from each other. Also, contact pads 340.1 may have smaller dimensions, and may be placed closer to each other, as they do not have to meet the BT substrate dimension requirements. Pads 340.1 can be copper/nickel/gold structures as in FIG. 12, or they can be made from other materials. The metal in vias 330.1 is insulated from substrate 140.1 by a dielectric 410 (FIG. 12).

In some embodiments, dies 124.1 have devices (e.g. transistors, diodes, and others) manufactured at the top surface (active surface). Solder balls 1210.1 are attached to the contact pads on top of the dies, possibly before the wafer thinning operation exposing the contact pads 340.1, as in FIG. 12.

Dies 124.2 may be similar to dies 124.1, but there is no solder on dies 124.2. Dies 124.2 include metalized vias 330.2 in semiconductor substrates 140.2, and contact pads 340.2 protruding out of the vias. The active surface of dies 124.2 is the top surface in some embodiments.

The third level dies 124.3 are like dies 124 in FIG. 3. Their active surface is the bottom surface. Solder 370 is attached to the bottom contact pads.

The manufacturing sequence is shown in FIG. 14. Solder 1210.0 is attached to interposer 120, possibly before the interposer thinning (step 1410). Then the interposer is attached to BT substrate 110 as described above (step 1420). During this step, the melting temperature of solder 930 (FIG. 12) increases and becomes higher than the melting temperature of solder 1210.0. Solder 1210.0 may or may not be melted during this step. The melting of solder 1210.0 does not present a problem because the dies 124.1 have not yet been attached to the interposer.

In some embodiments, all of solders 120.0, 120.1, 930, 370 are initially the same material. In an illustrative example, the solders are eutectic type LF128 described above, with the initial melting temperature of 218° C. The melting temperature of solder 930 increases to about 230° C. in step 1420.

At step 1430, dies 124.1 are soldered to interposer 120 with solder 1210.0, at a temperature of about 218° C. or higher, but below 230° C. not to melt the solder 930. The copper from contact pads 340.1 dissolves in solder 1210.0 and increases its melting temperature to about 230° C. Solder 1210.1 may melt, but its melting temperature does not increase because the solder 1210.1 is not in contact with copper or other material that could increase the solder melting temperature (the top surface portions of the top contact pads of die 124.1 are made of suitable materials to ensure that the solder melting temperature does not increase).

At step 1440, dies 124.2 are attached to dies 124.1 with solder 1210.1. Solders 1210.0 and 930 do not melt. The melting temperature of solder 1210.1 is increased to about 230° C. due to the diffusion of copper from contact pads 340.2.

At step 1450, dies 124.3 are flip-chip attached to dies 124.2 with solder 370. Solders 930, 1210.0, 1210.2 do not melt. If desired, the top contact pads on dies 124.2 may have copper to increase the melting temperature of solder 370. The higher melting temperature may be desirable to prevent the solder melting during the attachment of BT substrate 110 to PCB 130 (FIG. 3). For example, the solder 134 used for the PCB attachment may be the same material (LF128) as used for the previous steps.

Many variations are possible. For example, any number of dies can be used at each level. Also, one or more dies 124.2 can be attached directly to interposer 120, i.e. there may be three levels of dies over one interposer area but only two levels of dies over another interposer area. Any number of die levels can be present in different interposer areas.

Other solder types and melting temperatures can be used, and materials other than copper can be used to increase the melting temperatures. Different materials and contact pad structures can be used in different dies. The semiconductor substrates can be different semiconductor materials.

Varying the solder melting temperature to achieve a desired solder hierarchy is not limited to the interposer structures, but may be used in other semiconductor packages, known or to be invented, with or without interposers.

In some embodiments, interposer 120 and/or dies 124.1 are provided with deep cavities 920 at the top surface to increase the mechanical strength of the solder attachment and provide a reliable electrical contact. See FIG. 15. The attachment of dies 124.1 to interposer 120 is performed by the same techniques as the attachment of the interposer to BT substrate 110. The attachment of dies 124.2 to dies 124.1 can also be performed in this way.

Figure 15:
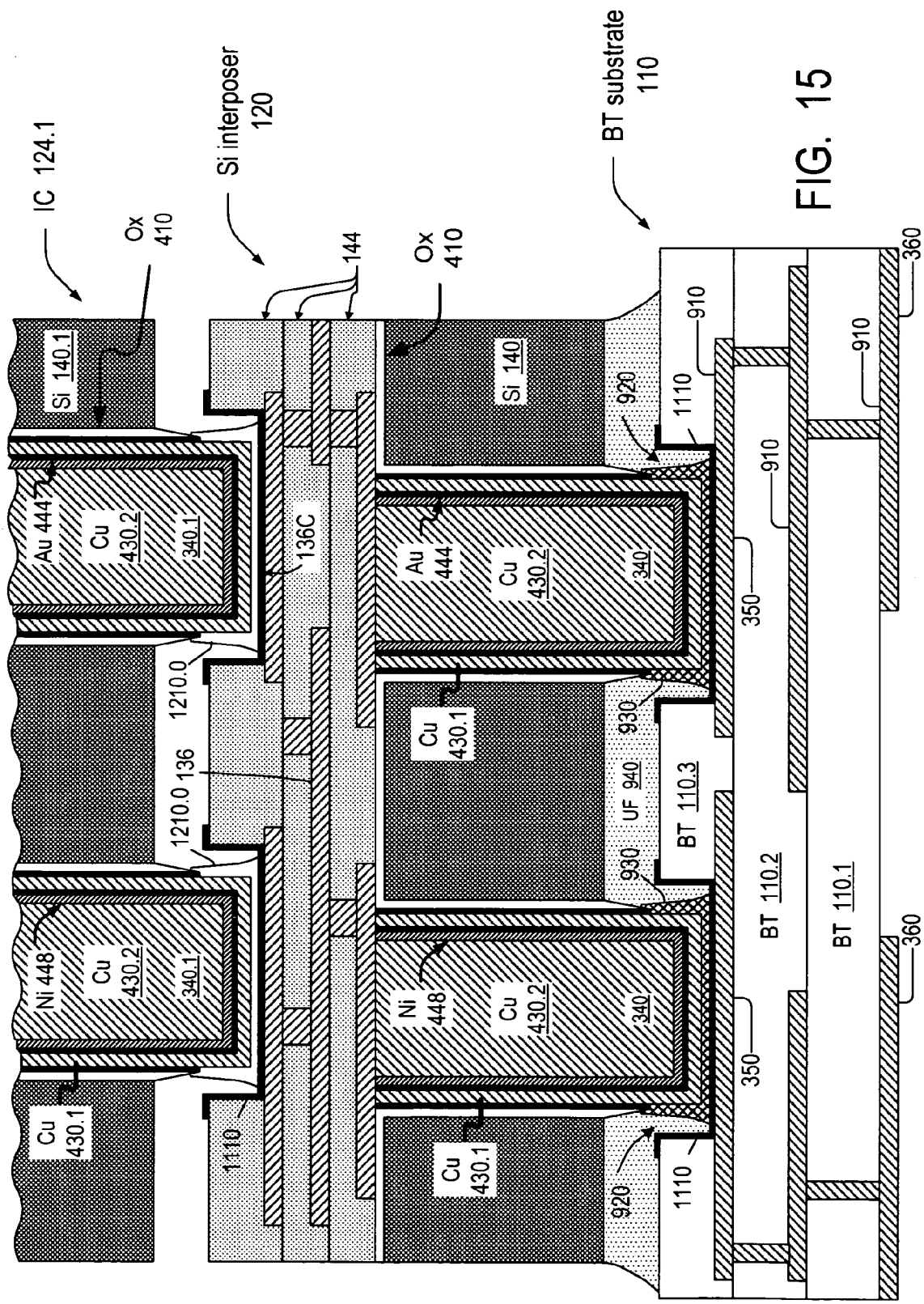
FIG. 15 shows a vertical cross section of an integrated circuit packaging structure according to one embodiment of the present invention.

As shown in FIG. 15, the top dielectric layer 144 in interposer 120 is a thick layer, e.g. 50 μm thick. This can be a photoimageable material such as described above for BT layer 110.3. Openings in top layer 144 expose contact pads 136C. Contact pads 340.1 on die 124.1 protrude by some distance, e.g. 50 μm, below the bottom surface of silicon substrate 140.1 of die 124.1. The contact pads are inserted into the cavities in the top surface of the interposer. These cavities are the openings in top layer 1-44 that expose the contact pads 136C.

Metal layer 1110 (e.g. gold or nickel) can be deposited on the sidewalls and bottom of the vias in top layer 144 to improve the electrical connection and provide a barrier against copper 136 diffusion into solder 1210.0. Alternatively, metal 1110 can be plated only on the bottom of the openings to provide a copper diffusion barrier.

In some embodiments, the same dimensions are obtained as for the attachment between the BT substrate and the interposer, i.e. the final value of the gap between the silicon 140.1 and interposer 120 is 25 μm (gap values of 5 to 10 μm and larger are believed to be appropriate to provide sufficient electrical insulation if no dielectric is formed on the bottom surface of silicon 140.1); the contact 340.1 portion inside the cavities in top layer 144 is 25 μm high (note dimension C1 in FIG. 10). This value is in the range from 10 μm to 45 μm in some embodiments. Other dimensions can also be used.

Underfill (not shown) can be injected between the interposer and the dies 124.1 using known techniques.

In some embodiments, dies 124.1 are attached to interposer 120 before the interposer is thinned. See the aforementioned U.S. Pat. No. 6,322,903. The attachment process can be the same as the process of attaching the interposer to BT substrate 110. For example, in some embodiments, before the interposer is thinned, solder paste 1210.0 is placed into the cavities on top of the interposer, then a no-fill underfill is dispensed and a die or dies 124.1 placed on the interposer, then a heating step is performed. A copper diffusion barrier can be omitted. Copper 1110 and/or 136 on top of the interposer and copper 430.1 from dies 124.1 dissolves in solder 1210.0 to increase the solder melting temperature. Then interposer 120 is thinned and attached to BT substrate 110. Solder 1210.0 will not melt during the attachment of interposer 120 to BT substrate 110.

The invention is not limited to the embodiments described above. For example, non-eutectic solders can be used. The "melting temperature" is any temperature as high or higher than the solidus and but not higher than the liquidus. As is known, the solidus is the highest temperature at which 100% of solder is solid, i.e. the solder is just beginning to melt. The liquidus is the lowest temperature at which 100% of the solder is liquid. For a eutectic solder, the solidus and the liquidus are the same.

Also, in some embodiments, the cavities 920 (FIG. 9) extend through two or more BT layers, for example, through layers 110.3 and 110.2. Contact pads 350 can thus be formed from the metal layer 910 located between the BT layers 110.1, 110.2. The layer 910 on BT layer 110.2 can be used for interconnects, power or ground planes, or other elements as discussed above. The invention is not limited to particular materials, dimensions and processes. For example, anisotropic adhesive, conductive epoxy, and/or thermocompression can be used instead of solder. The invention is applicable to non-silicon semiconductor interposers.

The interposer may include capacitors having a capacitance of 5.0 pF or higher. For example, capacitance values of 10 pF, 100 pF, or higher have been used on circuit boards to decouple the power lines from the ground lines or for other purposes, and such capacitors can be manufactured in the interposer. Resistors having resistance values of 10 Ω and higher (e.g. 50 Ω, 100 Ω, or 150 Ω) are used on circuit boards for line termination and other purposes, and they can be manufactured in the interposer. Inductors having inductance values of 100 nH or higher are commonly used on circuit boards and can be manufactured in the interposer. The invention is not limited to particular capacitance, resistance or inductance values. Other embodiments and variations are within the scope of the invention, as defined by the appended claims.

The invention claimed is:

1. A manufacturing method comprising:
   (1) obtaining an interposer comprising:
      a semiconductor substrate;
      one or more first conductive contact pads attachable to circuitry placed above the interposer;
      one or more second conductive contact pads attachable to circuitry placed below the interposer; and
      one or more conductive paths passing through the semiconductor substrate and connecting at least one of the first contact pads to at least one of the second contact pads;
      wherein each of the second contact pads protrudes out at a bottom surface of the interposer;
   (2) obtaining an intermediate integrated circuit packaging substrate comprising:
      a dielectric substrate or a plurality of dielectric substrates attached to each other;
      one or more first conductive contact pads attachable to circuitry above the intermediate substrate;
      one or more second conductive contact pads attachable to circuitry below the intermediate substrate;
      one or more conductive paths each of which connects at least one first contact pad of the intermediate substrate to at least one second contact pad of the intermediate substrate;

wherein each of the one or more first contact pads of the intermediate substrate is formed in a corresponding via in the top surface of the intermediate substrate, each via extending into at least one of the dielectric substrates;

(3) inserting the protruding second contact pads of the interposer into the corresponding vias of the intermediate substrate and attaching the second contact pads to the first contact pads of the intermediate substrate without melting of at least portions of the second contact pads of the interposer in the vias.

2. The method of claim 1 wherein the operation (3) is performed without melting of any portion of the second contact pads of the interposer.

3. The method of claim 1 wherein the operation (3) comprises soldering the second contact pads of the interposer to the first contact pads of the intermediate substrate with solder which is not part of the second contact pads of the interposer.

4. The method of claim 1 wherein after the operation (3) a spacing between the bottom surface of the semiconductor substrate and the top surface of the intermediate substrate is at least 5 μm.

5. The method of claim 1 wherein at least a portion of the bottom surface of the semiconductor substrate is not covered by any dielectric layer in the interposer.

6. The method of claim 1 wherein in the operation (3) at least 10 μm of each protrusion is inside of the corresponding via.

7. The method of claim 1 wherein the intermediate substrate comprises said plurality of the dielectric substrates.

8. The method of claim 7 wherein each of the vias in the intermediate substrate passes through at least one of the dielectric substrates.

9. The method of claim 7 wherein the adjacent dielectric substrates are separated by conductive layers, and at least one of the conductive paths of the intermediate substrate passes through the conductive layers and through the dielectric substrates.

10. The method of claim 9 wherein all of the dielectric substrates are made of the same material.

11. The method of claim 1 wherein the dielectric substrate or substrates are made of an organic material.

12. The method of claim 1 wherein the dielectric substrate or substrates are made of bis-maleimide triazine (BT).

13. A manufacturing method comprising:
(1) obtaining a first structure comprising:
a first semiconductor substrate;
one or more first conductive contact pads attachable to circuitry placed above the first structure;
one or more second conductive contact pads attachable to circuitry placed below the first structure; and
one or more conductive paths passing through the first semiconductor substrate and connecting at least one of the first contact pads to at least one of the second contact pads;
wherein each of the second contact pads is provided by a conductor formed in a corresponding via in the first semiconductor substrate and protruding downward out of the via and out of the first structure at a bottom surface of the first structure, the conductor providing a downward protrusion underneath the via at the bottom surface of the first structure;
(2) obtaining a second structure comprising:
a second semiconductor substrate;
a dielectric layer overlying the second semiconductor substrate;
one or more first conductive contact pads attachable to circuitry above the second structure;
wherein each of the one or more first contact pads of the second structure is formed in a corresponding via in the top surface of the second structure, each via extending into the dielectric layer;
(3) inserting the protrusions formed by the conductors of the first structure into the corresponding vias of the second structure and attaching the protrusions to the first contact pads of the intermediate substrate in the vias in the second structure.

14. The method of claim 13 wherein the second structure further comprises:
one or more second conductive contact pads attachable to circuitry below the second structure; and
one or more conductive paths each of which passes through the second semiconductor substrate and connects at least one first contact pad of the second structure to at least one second contact pad of the second structure.

15. The method of claim 13 wherein the second structure is an interposer which is an intermediate integrated circuit packaging substrate.

16. The method of claim 13 wherein after the operation (3) the bottom surface of the first semiconductor substrate is spaced from the top surface of the second structure.

17. The method of claim 16 wherein after the operation (3) a spacing between the bottom surface of the first semiconductor substrate and the top surface of the second structure is at least 5 μm.

18. The method of claim 13 wherein at least a portion of the bottom surface of the first semiconductor substrate is not covered by any dielectric layer in the first structure.

19. The method of claim 13 wherein in the operation (3) at least 10 μm of each protrusion is inside of the corresponding via.

20. A manufacturing method comprising:
(1) obtaining a first structure comprising:
a first semiconductor substrate;
one or more first conductive contact pads attachable to circuitry placed above the first structure;
one or more second conductive contact pads attachable to circuitry placed below the first structure; and
one or more conductive paths passing through the first semiconductor substrate and connecting at least one of the first contact pads to at least one of the second contact pads;
wherein each of the second contact pads protrudes out at a bottom surface of the first structure;
(2) obtaining a second structure comprising:
a second semiconductor substrate;
a dielectric layer overlying the second semiconductor substrate;
one or more first conductive contact pads attachable to circuitry above the second structure;
wherein each of the one or more first contact pads of the second structure is formed in a corresponding via in the top surface of the second structure, each via extending into the dielectric layer;
(3) inserting the protruding second contact pads of the first structure into the corresponding vias of the second structure and attaching the second contact pads to the first contact pads of the second structure without melting of at least portions of the second contact pads of the first structure in the vias.

21. The method of claim 20 wherein the second structure further comprises:

one or more second conductive contact pads attachable to circuitry below the second structure; and one or more conductive paths each of which passes through the second semiconductor substrate and connects at least one first contact pad of the second structure to at least one second contact pad of the second structure.

22. The method of claim 20 wherein the second structure is an interposer which is an intermediate integrated circuit packaging substrate.

23. The method of claim 20 wherein the operation (3) is performed without melting of any portion of the second contact pads of the first structure.

24. The method of claim 20 wherein the operation (3) comprises soldering the second contact pads of the first structure to the first contact pads of the second structure with solder which is not part of the second contact pads of the first structure.

25. The method of claim 20 wherein after the operation (3) a spacing between the bottom surface of the first semiconductor substrate and the top surface of the second structure is at least 5 μm.

26. The method of claim 20 wherein at least a portion of the bottom surface of the first semiconductor substrate is not covered by any dielectric layer in the first structure.

27. The method of claim 20 wherein in the operation (3) at least 10 μm of each protrusion is inside of the corresponding via.

* * * * *